United States Patent
Wu et al.

(10) Patent No.: US 8,106,470 B2
(45) Date of Patent: Jan. 31, 2012

(54) TRIPLE-AXIS MEMS ACCELEROMETER HAVING A BOTTOM CAPACITOR

(75) Inventors: Ting-Hau Wu, Yilan (TW); Chun-Wen Cheng, Zhubei (TW); Chun-Ren Cheng, Hsin-Chu (TW); Shang-Ying Tsai, Jhongli (TW); Jung-Huei Peng, Jhubei (TW); Jiou-Kang Lee, Zhu-Bei (TW); Allen Timothy Chang, Taipei (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 184 days.

(21) Appl. No.: 12/751,633

(22) Filed: Mar. 31, 2010

(65) Prior Publication Data

US 2010/0308424 A1 Dec. 9, 2010

Related U.S. Application Data

(60) Provisional application No. 61/185,493, filed on Jun. 9, 2009.

(51) Int. Cl.
 *H01L 21/32* (2006.01)
(52) U.S. Cl. . 257/415; 257/254; 257/307; 257/E21.002; 257/E21.211; 257/E21.235; 257/E29.234; 257/E29.324; 257/E31.032
(58) Field of Classification Search .......... 257/254–259, 257/307, 415, 418, 680, 704, E21.002, 211, 257/235, 29.234, 324, 31.032
See application file for complete search history.

(56) References Cited

U.S. PATENT DOCUMENTS

| | | | |
|---|---|---|---|
| 7,346,178 | B2 | 3/2008 | Zhe et al. |
| 7,767,483 | B1 * | 8/2010 | Waters ............................ 438/51 |
| 7,825,484 | B2 * | 11/2010 | Martin et al. .................. 257/415 |
| 7,892,876 | B2 * | 2/2011 | Mehregany ...................... 438/51 |
| 2004/0166688 | A1 * | 8/2004 | Xie et al. ...................... 438/706 |
| 2004/0231420 | A1 * | 11/2004 | Xie et al. ................... 73/514.32 |
| 2006/0054983 | A1 * | 3/2006 | Acar et al. .................... 257/415 |
| 2006/0272413 | A1 * | 12/2006 | Vaganov et al. ............ 73/514.01 |
| 2010/0075481 | A1 * | 3/2010 | Yang ............................ 438/458 |
| 2010/0147076 | A1 * | 6/2010 | Diamond et al. .......... 73/514.32 |
| 2010/0212425 | A1 * | 8/2010 | Hsu et al. ................... 73/514.32 |
| 2010/0301433 | A1 * | 12/2010 | Wu et al. ...................... 257/418 |
| 2011/0049648 | A1 * | 3/2011 | Geisberger .................... 257/415 |
| 2011/0209343 | A1 * | 9/2011 | Mehregany ..................... 29/847 |

FOREIGN PATENT DOCUMENTS

WO WO 90/10843 9/1990

OTHER PUBLICATIONS

Qu, H., et al., "A Single-Crystal Silicon 3-axis CMOS-MEMS Accelerometer," Proceedings of IEEE Sensors, Oct. 2004, pp. 661-664.

* cited by examiner

*Primary Examiner* — Michael Lebentritt
(74) *Attorney, Agent, or Firm* — Slater & Matsil, L.L.P.

(57) ABSTRACT

An integrated circuit structure includes a substrate having a top surface; a first conductive layer over and contacting the top surface of the substrate; a dielectric layer over and contacting the first conductive layer, wherein the dielectric layer includes an opening exposing a portion of the first conductive layer; and a proof-mass in the opening and including a second conductive layer at a bottom of the proof-mass. The second conductive layer is spaced apart from the portion of the first conductive layer by an air space. Springs anchor the proof-mass to portions of the dielectric layer encircling the opening. The springs are configured to allow the proof-mass to make three-dimensional movements.

20 Claims, 14 Drawing Sheets

TRIPLE-AXIS MEMS ACCELEROMETER HAVING A BOTTOM CAPACITOR

This application claims the benefit of U.S. Provisional Application No. 61/185,493 filed on Jun. 9, 2009, entitled "Triple-Axis MEMS Accelerometer Having a Bottom Capacitor," which application is hereby incorporated herein by reference.

TECHNICAL FIELD

This invention relates generally to integrated circuit structures and manufacturing processes, and more particularly to micro-electro-mechanical system (MEMS) accelerometers, and even more particularly to triple-axis accelerometers.

BACKGROUND

Accelerometers may be used to detect the acceleration rate of moving objects, such as cars, airplanes, or the like. FIG. 1A illustrates a top view of a conventional single-axis accelerometer 100. A cross-sectional view of accelerometer 100 is shown in FIG. 1B, wherein the cross-sectional view is taken along a plane crossing line 1B-1B in FIG. 1A. In the center of accelerometer 100, there is proof-mass 102 that has a relatively great mass. Springs 104 support proof-mass 102 (also refer to FIG. 1B), and allow proof-mass 102 to move in the x directions (either +x or −x directions). Proof-mass 102 is supported by springs 104. Proof-mass 102 and conductive components 108 are both conductive, and hence form capacitors. If accelerometer 100 does not experience acceleration, proof-mass 102 is located at a balance point. When accelerometer 100 does experience acceleration in one of the +x and −x directions, proof-mass 102 will move to the direction opposite of the acceleration direction. The capacitance between proof-mass 102 and conductive components 108 changes accordingly. By measuring the change in the capacitance, the acceleration rate and the acceleration direction (+x direction or −x direction) may be calculated.

FIG. 2 illustrates a top view of a double-axis accelerometer, which may move in both x (+x and −x) directions and y (+y and −y) directions. The mechanism is similar to the mechanism of the single-axis accelerometer, except the springs are also formed in the y directions (+y and −y directions), and the corresponding capacitances reflecting the movement of proof-mass 102 in the y directions are also measured.

SUMMARY OF THE INVENTION

In accordance with one aspect of the present invention, an integrated circuit structure includes a substrate having a top surface; a first conductive layer over and contacting the top surface of the substrate; a dielectric layer over and contacting the first conductive layer, wherein the dielectric layer includes an opening exposing a portion of the first conductive layer; and a proof-mass in the opening and including a second conductive layer at a bottom of the proof-mass. The second conductive layer is spaced apart from the portion of the first conductive layer by an air space. Springs anchor the proof-mass to portions of the dielectric layer encircling the opening. The springs are configured to allow the proof-mass to make three-dimensional movements.

Other embodiments are also disclosed.

The advantageous features of the present invention include increased sensitivity in the detection of the acceleration in z-directions and improved reliability.

BRIEF DESCRIPTION OF THE DRAWINGS

For a more complete understanding of the present invention, and the advantages thereof, reference is now made to the following descriptions taken in conjunction with the accompanying drawings, in which.

DETAILED DESCRIPTION OF ILLUSTRATIVE EMBODIMENTS

The making and using of the embodiments of the present invention are discussed in detail below. It should be appreciated, however, that the embodiments provide many applicable inventive concepts that can be embodied in a wide variety of specific contexts. The specific embodiments discussed are merely illustrative of specific ways to make and use the invention and do not limit the scope of the invention.

A novel triple-axis accelerometer and the method of forming the same are presented. The intermediate stages of manufacturing an embodiment of the present invention are illustrated. The variations and the operation of the embodiment are then discussed. Throughout the various views and illustrative embodiments of the present invention, like reference numbers are used to designate like elements. Each figure number may be followed by letter A, B or C, wherein figures denoted with a same number but different letters may illustrate different views of a same structure.

Figure 1A:
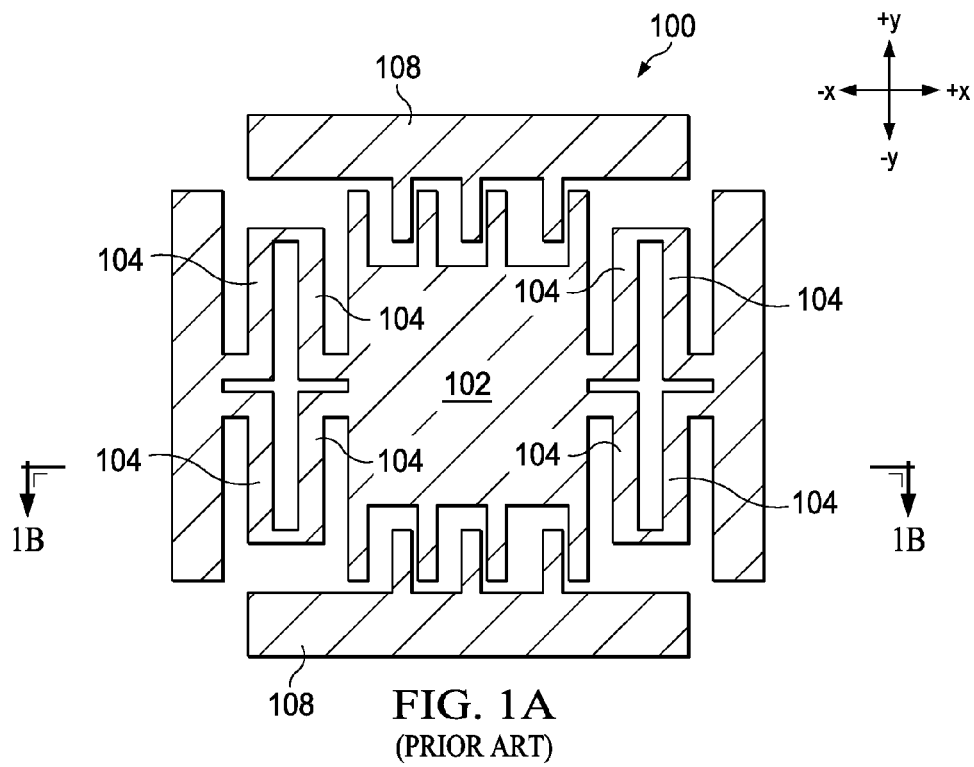
FIGS. 1A and 1B illustrate a top view and a cross-sectional view, respectively, of a conventional single-direction accelerometer.
Figure 1B:
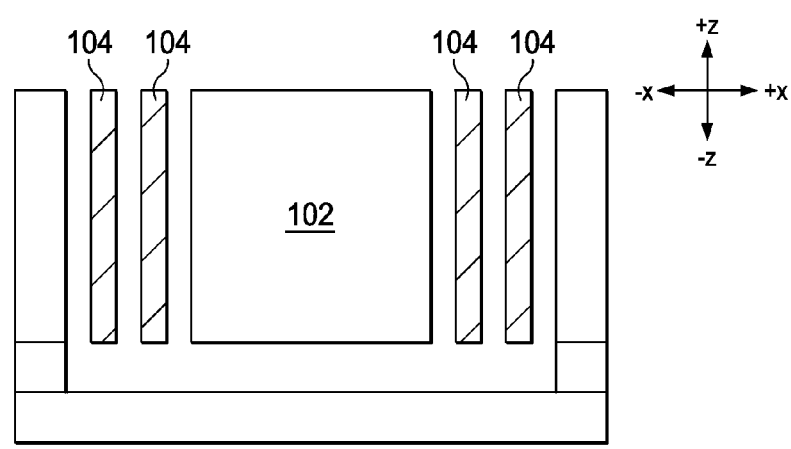
Figure 2:
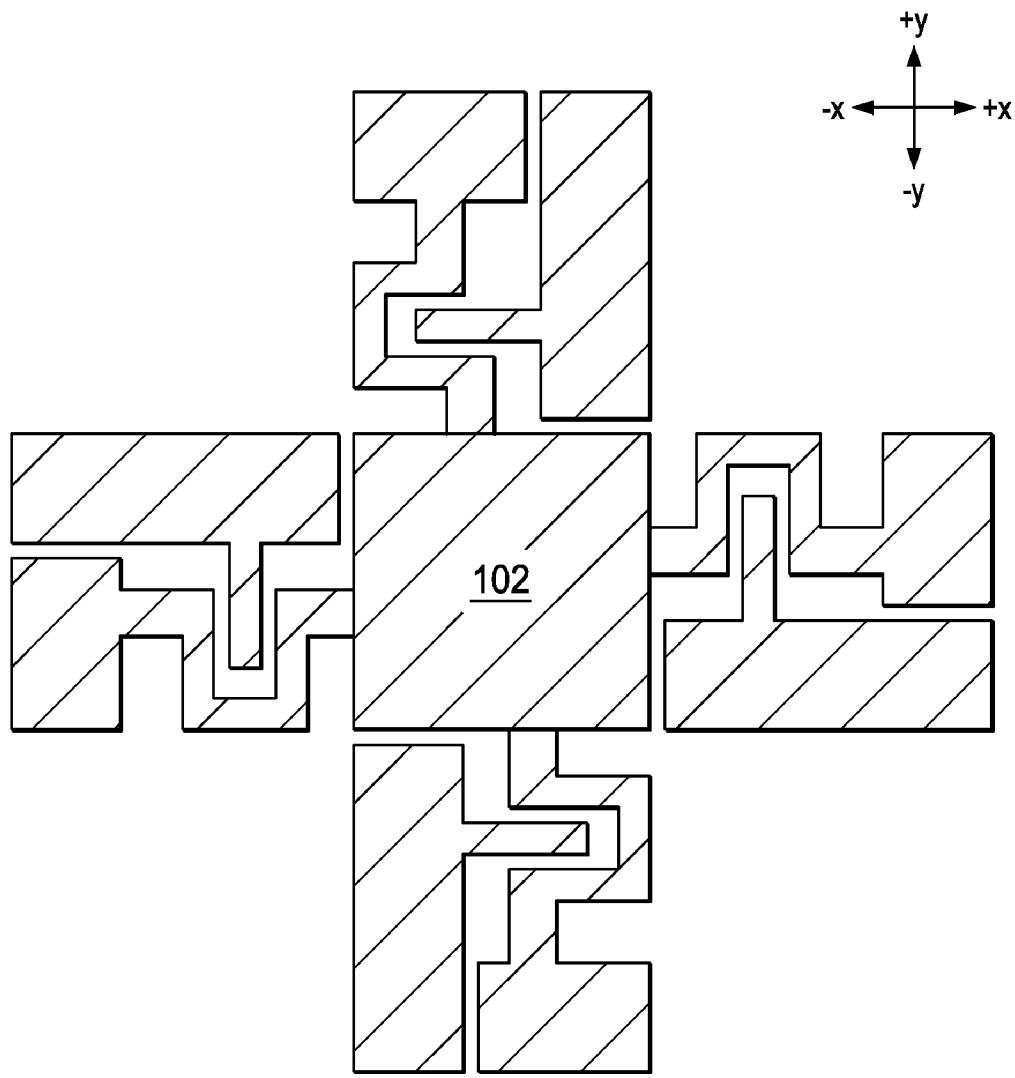
FIG. 2 illustrates a top view of a conventional double-axis accelerometer.
Figure 3:
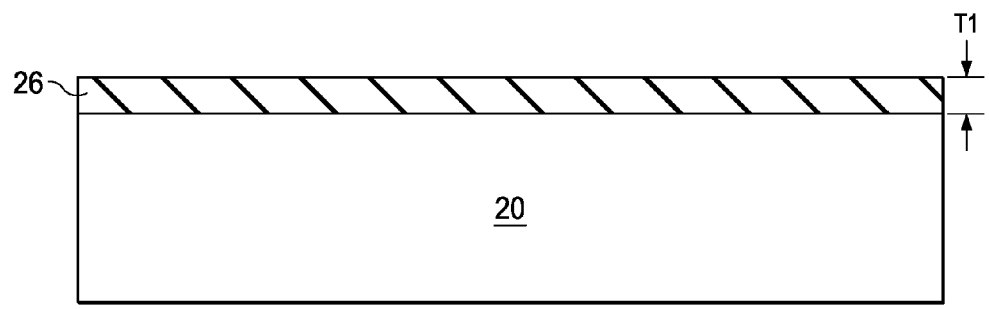
FIGS. 3 through 13 are top views and cross-sectional views of intermediate stages in the manufacturing of a double-axis accelerometer.

Referring to FIG. 3, substrate 20 is provided. In an embodiment, substrate 20 is a bulk semiconductor substrate, such as a bulk silicon substrate, although it may also be formed of other commonly used semiconductor materials, including group III, group IV, and/or group V materials. In alternative embodiments, substrate 20 may be formed of other materials such as dielectric materials. First conductive layer 26 is formed on substrate 20. In an embodiment, first conductive layer 26 is formed of polysilicon (also referred to as polysilicon layer 26, although it may also be formed of other materials), which may be doped with a p-type or n-type impurity to increase its conductivity. In alternative embodiments, first conductive layer 26 may be formed of metals, metal alloys, or the like. In an exemplary embodiment, thickness T1 of first silicon layer 26 may be between about 1 μm and about 2 μm, although it may also be greater or smaller. It is realized, however, that the dimensions recited throughout the description are merely examples, and may be changed if different formation technologies are used.

Figure 4A:
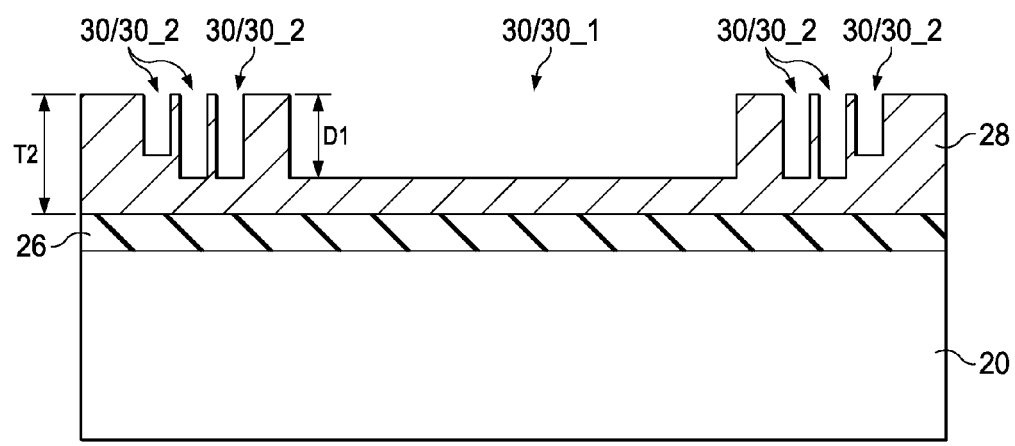

Referring to FIG. 4A, dielectric layer 28 is formed, followed by a deep etch step to pattern dielectric layer 28. Recesses (also referred to as openings throughout the description) 30 are thus formed. Dielectric layer 28 may be formed of silicon oxide, wherein the formation methods include commonly used deposition methods, such as plasma enhanced chemical vapor deposition (PECVD). After the patterning, a remaining layer is left un-etched under recesses 30. Thickness T2 of dielectric layer 28 may be between about 20 μm and about 30 μm, while depth D1 of recesses 30 may be between about 17 μm and about 27 μm, although different thicknesses and depths are also applicable. In an exemplary embodiment, thickness T2 is about 30 µm, while depth D1 is about 27 µm. Recesses 30 include proof-mass recess 30_1 and spring recesses 30_2.

Figure 4B:
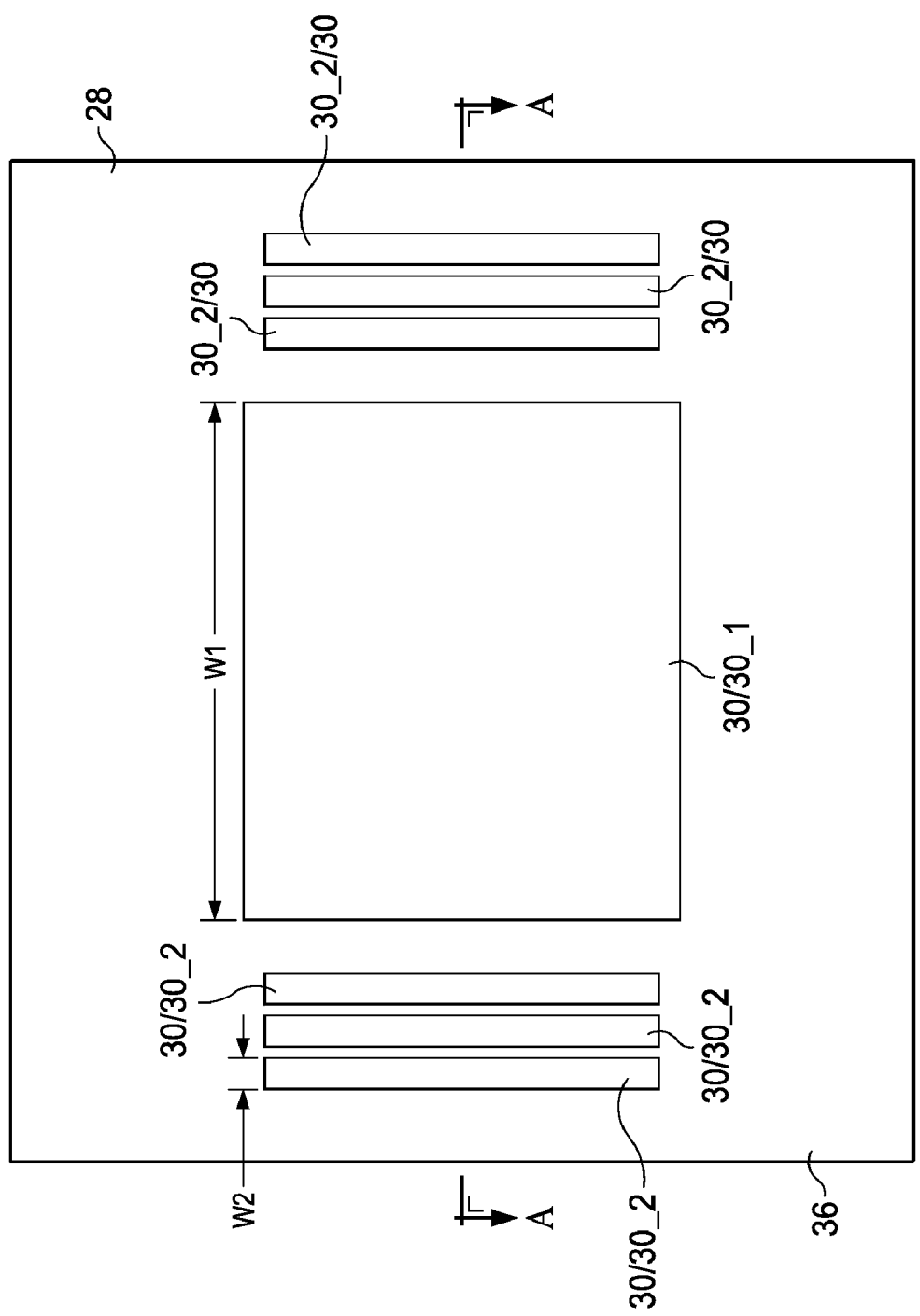

FIG. 4B illustrates a top view of dielectric layer 28 and recesses 30. The cross-sectional views throughout all drawings, unless specified otherwise, are made through the same plane crossing line A-A in FIG. 4B. In an embodiment, proof-mass recess 30_1 has width W1 greater than width W2 of spring recesses 30_2. For example, width W1 may be several hundred micrometers, while width W2 may be only about 10 µm or less, although it may also be greater.

Figure 5:
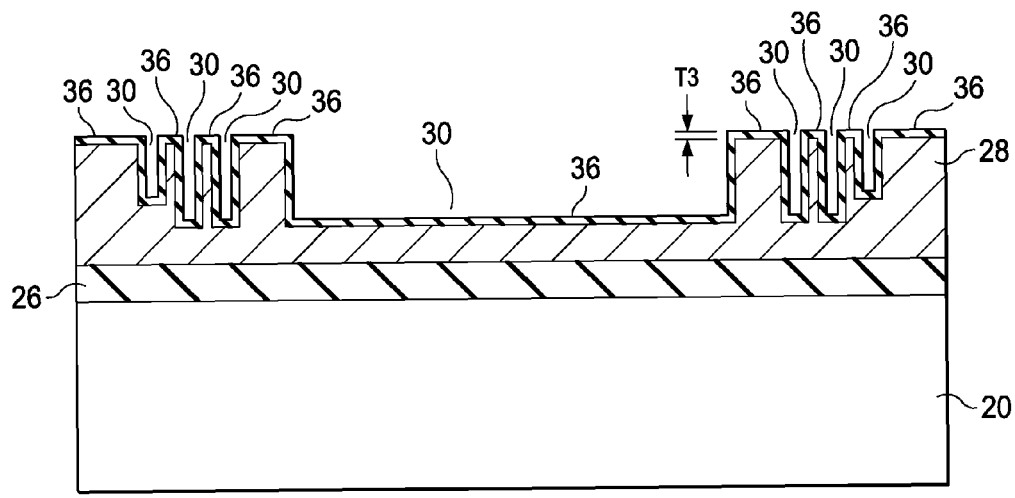

Referring to FIG. 5, second conductive layer 36 is blanket formed. Second conductive layer 36 may be formed of a same material as first conductive layer 26, although they can also be formed of different materials. Preferably, the formation is conformal so that vertical portions of second conductive layer 36 have substantially a same thickness as the horizontal portions. Thickness T3 of second conductive layer 36 may be between about 1 µm and about 2 µm. In an exemplary embodiment, thickness T3 is about 2 µm. Second conductive layer 36 may be formed of polysilicon (also referred to as polysilicon layer 36, although it may also be formed of other conductive materials). Second conductive layer 36 may be doped with a p-type or n-type impurity to increase its conductivity.

Figure 6:
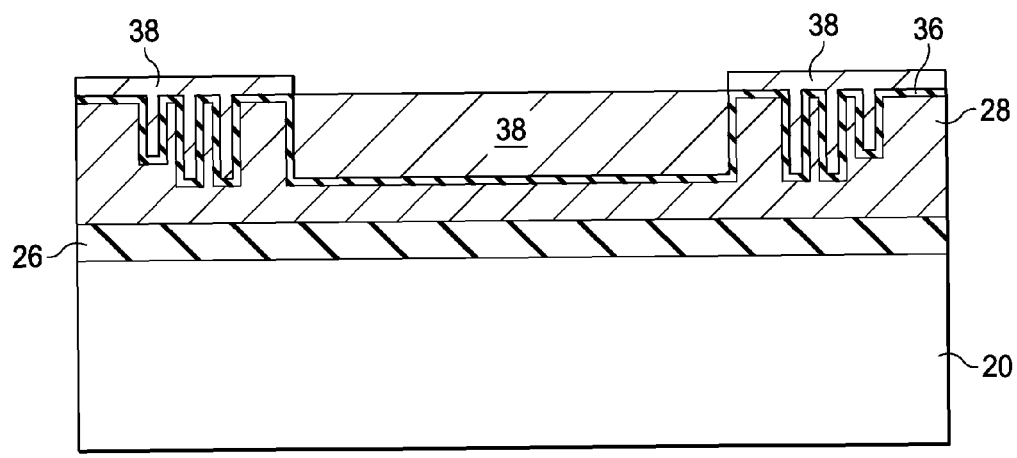

Next, as shown in FIG. 6, filling material 38 is filled into recesses 30 until the top surface of filling material 38 is higher than the top surface of second conductive layer 36. In an embodiment, filling material 38 may be an oxide, such as silicon oxide, which may also be formed of PECVD or other deposition methods. In other embodiments, filling material 38 may be any other material that has a high etching selectivity relative to second conductive layer 36.

Figure 7A:
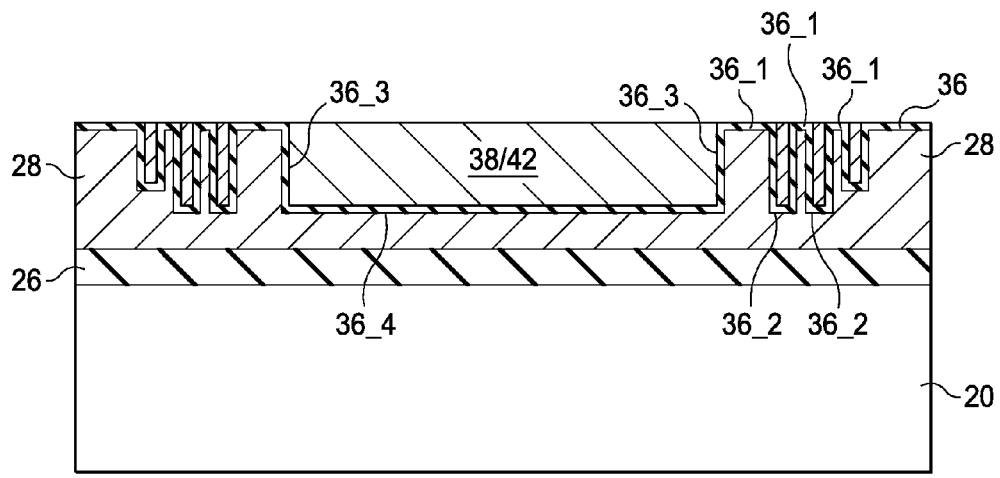
Figure 7B:
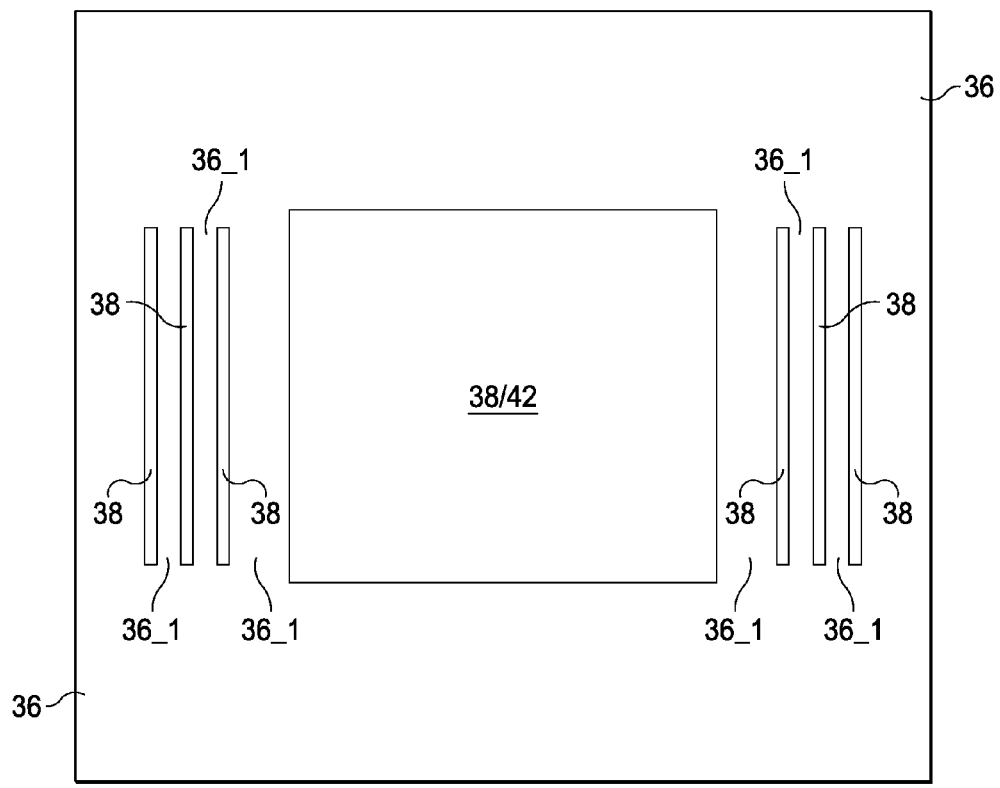
Figure 7C:
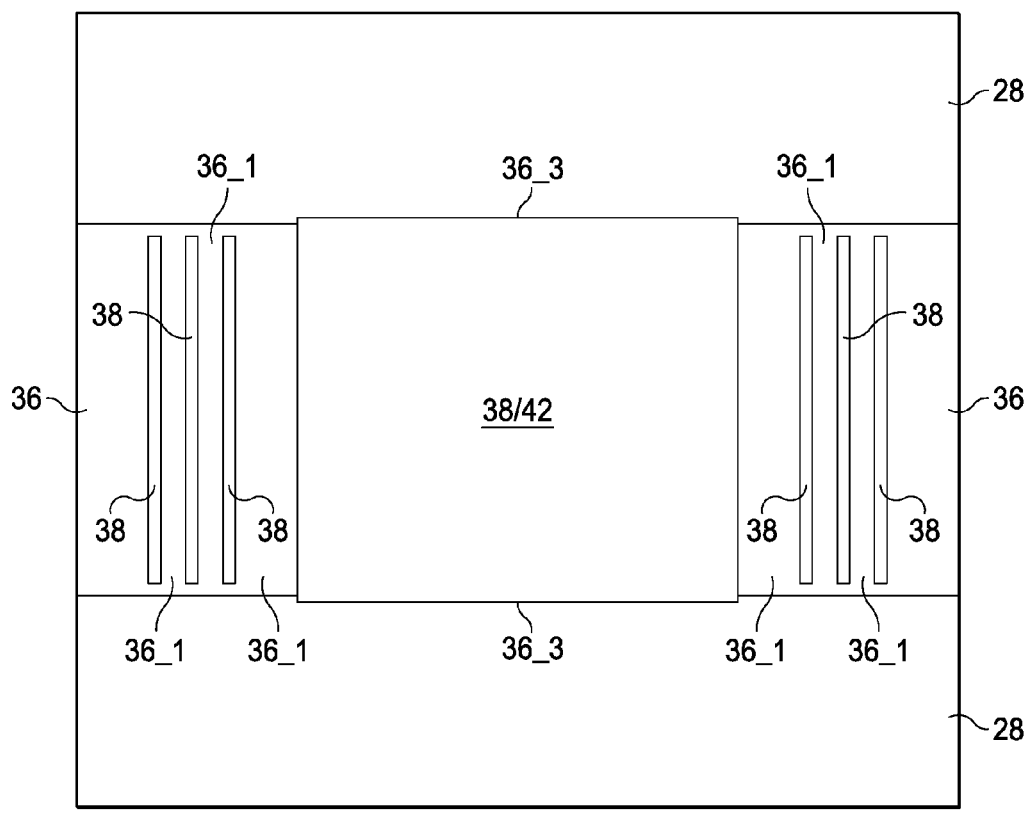

FIGS. 7A through 7C illustrate resulting structures after planarization and patterning steps are performed. In FIG. 7A, a planarization is performed. For example, an etching may be performed, so that the portion of remaining portions of filling material 38 have top surfaces substantially level with the top surface of second conductive layer 36, while excess portions are removed. The top view of the resulting structure is shown in FIG. 7B, which shows that portions 36_1 of polysilicon layer 36 are exposed, while portions 36_2 (not shown in FIG. 7B, please refer to FIG. 7A) are buried under remaining portions of filling material 38.

Referring to FIG. 7C, second conductive layer 36 is patterned. In the remaining structure, portions of second conductive layer 36 around proof-mass recess 30_1 and spring-mass recesses 30_2 are left, while other portions may be removed. It is appreciated that a portion of filling material 38 is encircled by portions 36_3 of second conductive layer 36. Accordingly, the remaining portions of second conductive layer 36 form a structure having the shape of a sauce pan, except the top view of the sauce pan is rectangular instead of being rounded. The source pan has portions 36_3 as sidewalls and portion 36_4 (referring to FIG. 7A) as the bottom. A portion of filling material 38 in the sauce pan is contained by the remaining portions of second conductive layer 36, and is referred to as central block 42 hereinafter.

Figure 8A:
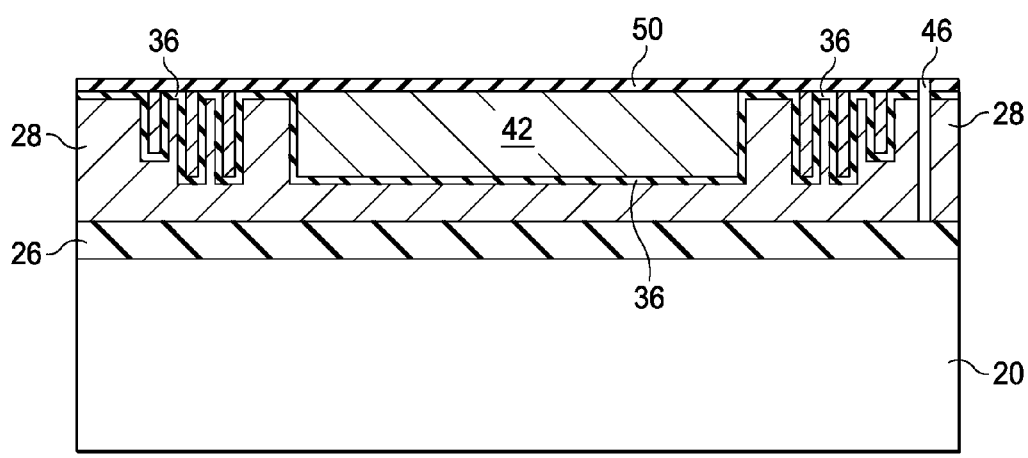
Figure 8B:
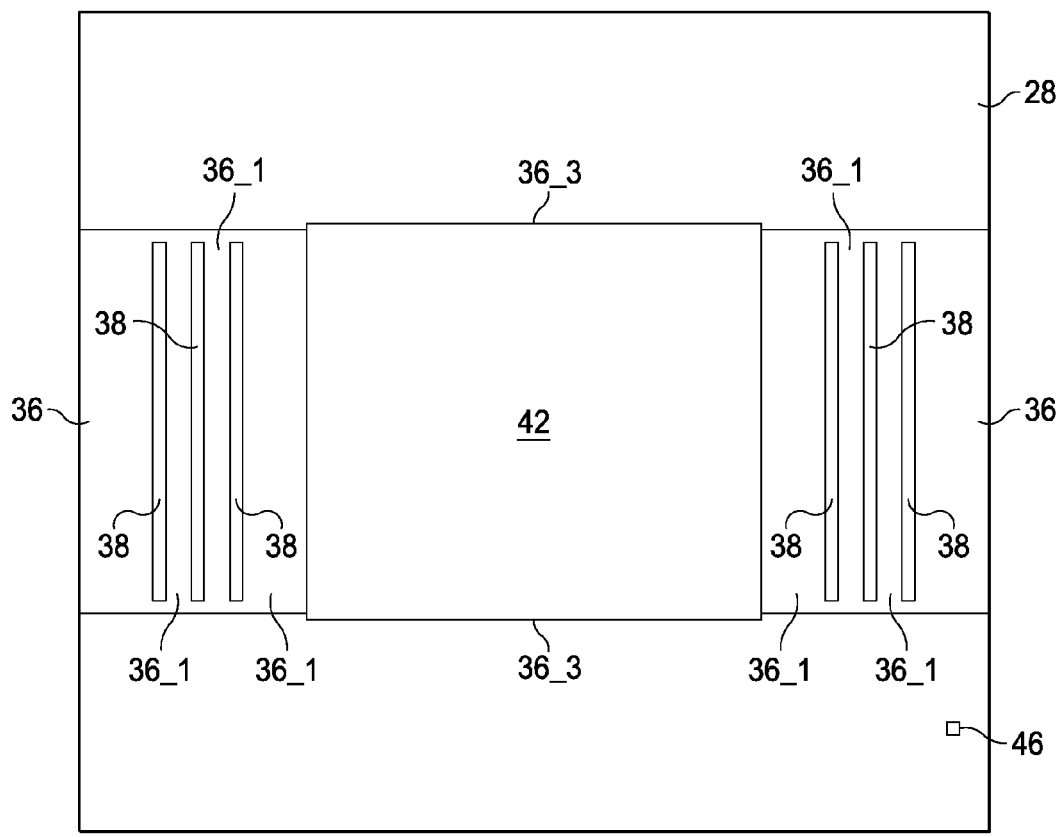

In FIG. 8A, contact opening 46 is formed, which penetrates though dielectric layer 28, so that polysilicon layer 26 is exposed through contact opening 46. FIG. 8B illustrates a top view. Please note that in FIG. 8B, contact opening 46 is actually not in the same cross-sectional view of FIG. 8A. However, for the convenience of illustration, they are illustrated in a same plane in FIG. 8A.

Figure 9:
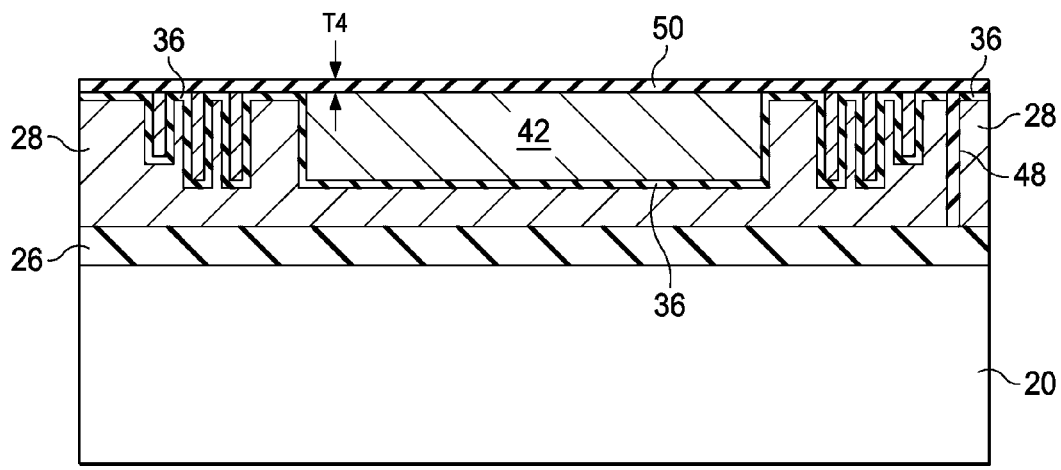

FIG. 9 illustrates the filling of contact opening 46 by contact plug 48. In addition to filling contact opening 46, the surface of the structure as shown in FIG. 8A is blanket covered by conductive layer 50. Accordingly, contact plug 48 may be formed of a same material as conductive layer 50. Again, conductive layer 50 may be formed of doped polysilicon, also referred to as polysilicon layer 50, although it may also be formed of other conductive materials, such as metals, metal silicides, metal alloys, and/or the like. Further, for process convenience, conductive layer 50 and second conductive layer 36 may be formed of a same material, such as polysilicon. Polysilicon layer 50 has thickness T4, which may be between about 2 µm and about 4 µm. In an exemplary embodiment, thickness T4 is about 2 µm. Polysilicon layer 50 covers central block 42. Accordingly, central block 42 is fully enclosed by second conductive layer 36 (from the sides and the bottom) and polysilicon layer 50 (from the top).

Figure 10A:
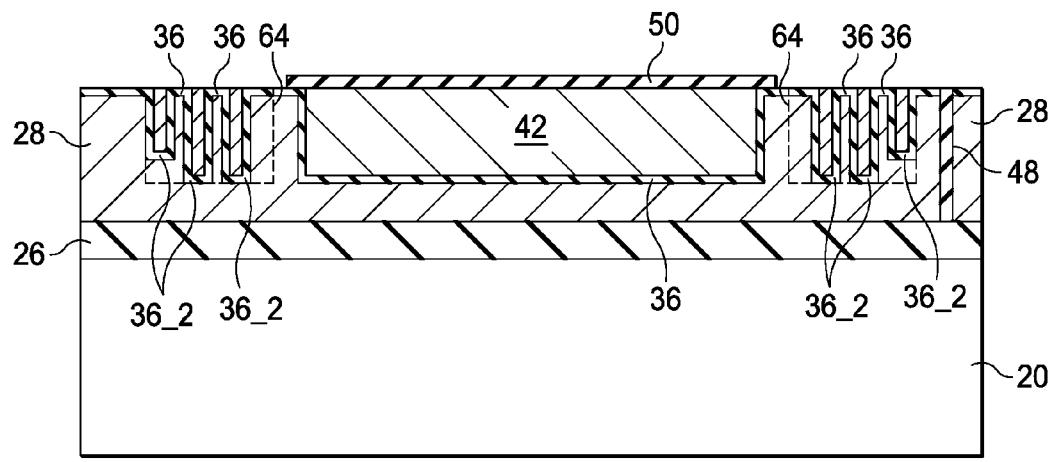
Figure 10B:
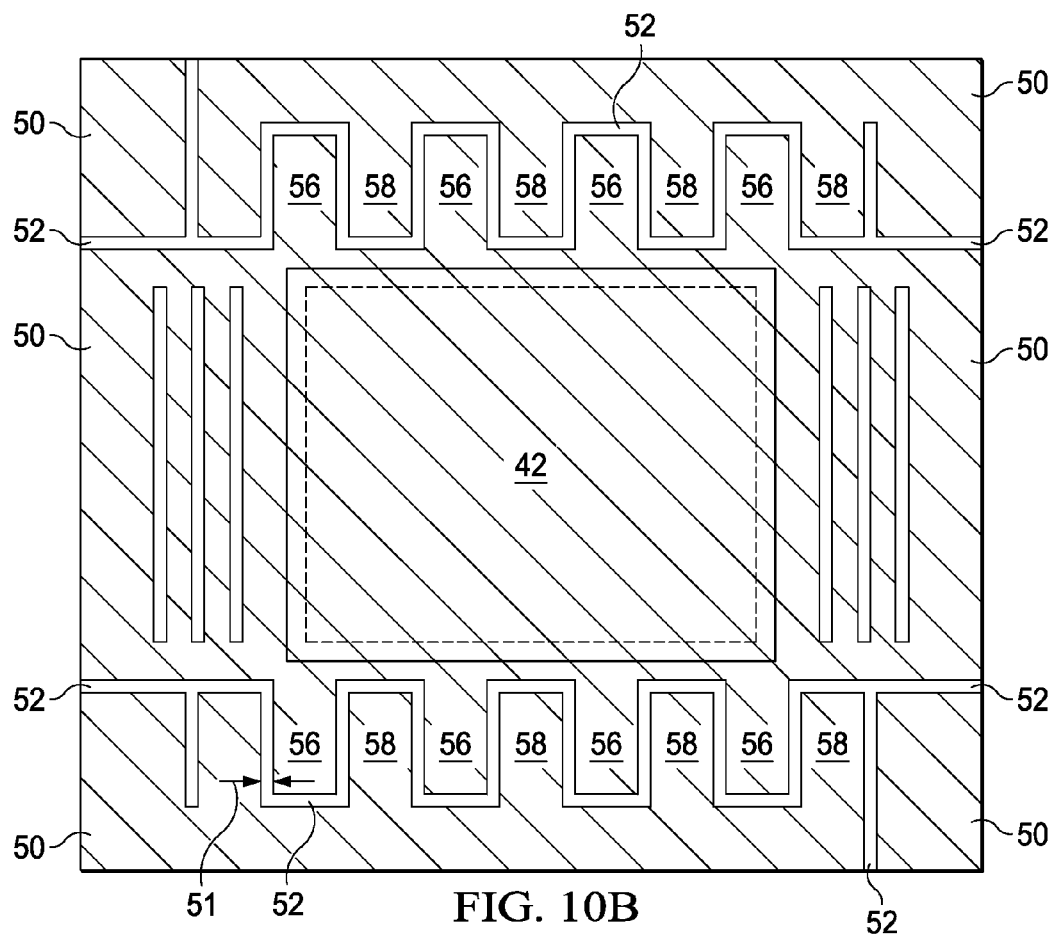
Figure 10C:
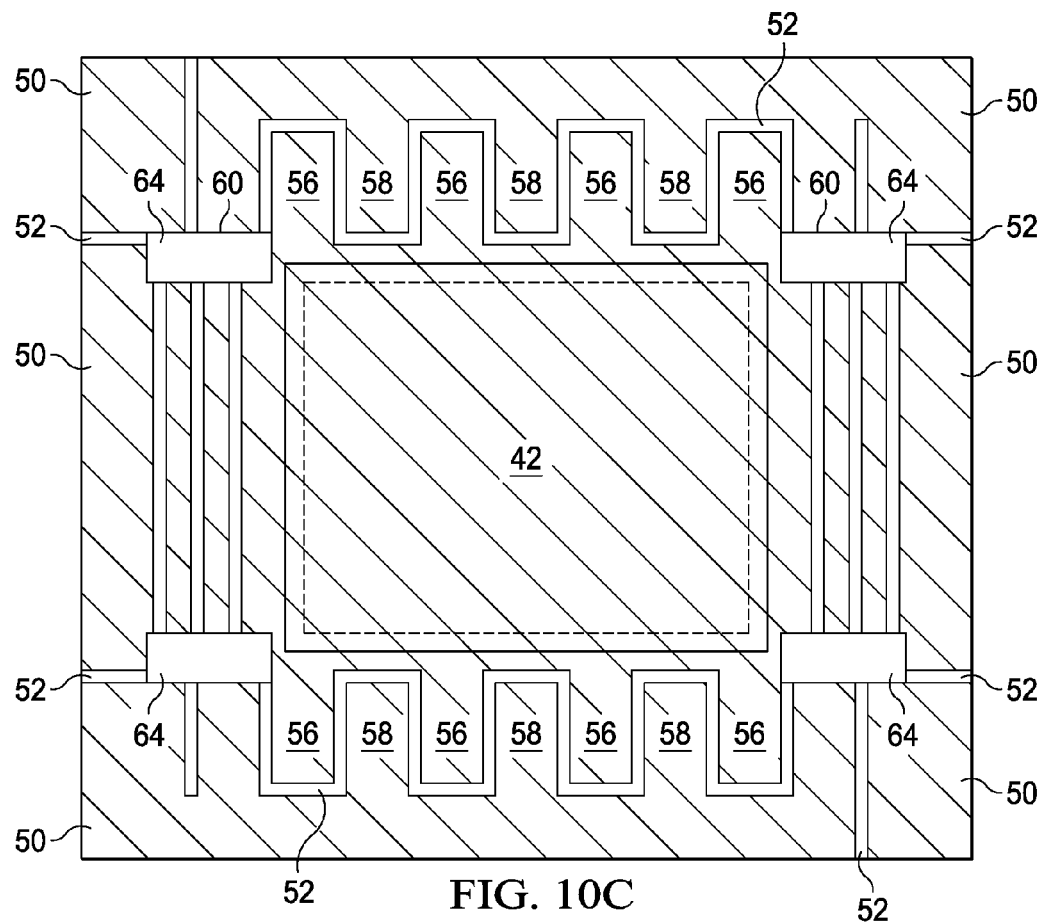

FIG. 10A, and FIGS. 10B and 10C, respectively, illustrate a top view and cross-sectional views of the structure after a patterning(s) is performed. Referring to FIG. 10B, a first patterning is performed to remove portions of polysilicon layer 50 to form openings 52, through which underlying dielectric layer 28 is exposed. Accordingly, polysilicon fingers 56 and 58 are formed, and are disconnected from each other. The patterning of second conductive layer 36 may be self-stopped on dielectric layer 28. Accordingly, the depth of openings 52 may be the thickness of polysilicon layer 50. In the final double-axis or triple-axis accelerometer, the capacitance between fingers 56 and 58 may be used to determine the acceleration rate. The distance between fingers 56 and 58 is thus designed accordingly based on the desirable capacitance range. In an exemplary embodiment, distance S1 is about 1.5 µm. The first patterning is performed using a first mask, which has the same pattern as shown in FIG. 10B.

FIG. 10C illustrates a top view of the structure after a second patterning is performed. In the second patterning, a mask, for example, a photo resist, is formed to cover the structure as shown in FIG. 10B, except the portions of the structure in rectangles 60 are exposed. An etch is then performed to remove portions of polysilicon layer 50 and dielectric layer 28 inside rectangles 60, wherein the etch is not stopped until the resulting recesses 64 reach the bottom of portion 36_2 (please refer to FIG. 7A) of second conductive layer 36. Referring to FIG. 10A, dotted lines represent the boundaries of exemplary recesses 64. Please note that recesses 64 are not in a same vertical plane as shown in FIG. 10A, and hence are illustrated using dotted lines. The recessing shown in FIG. 10C is for disconnecting the resulting proof-mass (not shown) from the connecting dielectric layer 28, so that the proof-mass may move freely, as will be discussed in subsequent paragraphs.

Figure 11A:
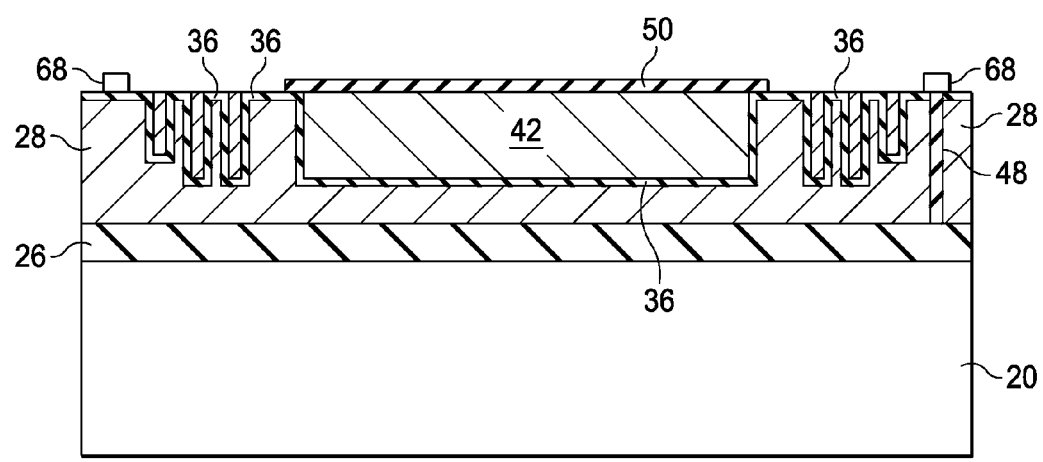
Figure 11B:
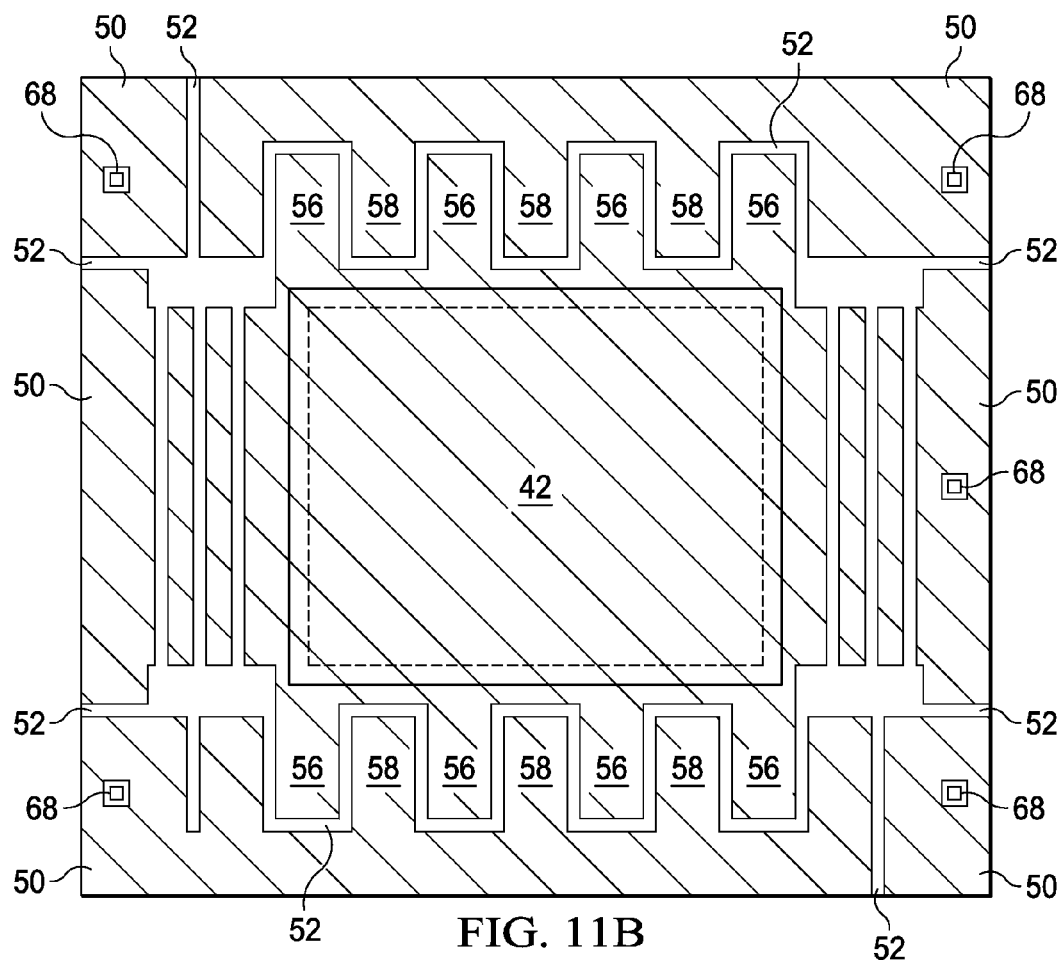

Referring to FIGS. 11A and 11B, contact pads 68 are formed. In an embodiment, contact pads 68 are formed by depositing a metallic material, such as AlCu, and patterning the metallic material. A protection layer such as Ni, gold, and the like, may also be applied as a surface layer of contact pads 68. Contact pads 68 may also be eutectic bonds formed of eutectic materials, such as Sn—Ag alloy or Sn—Sb alloy.

Figure 12A:
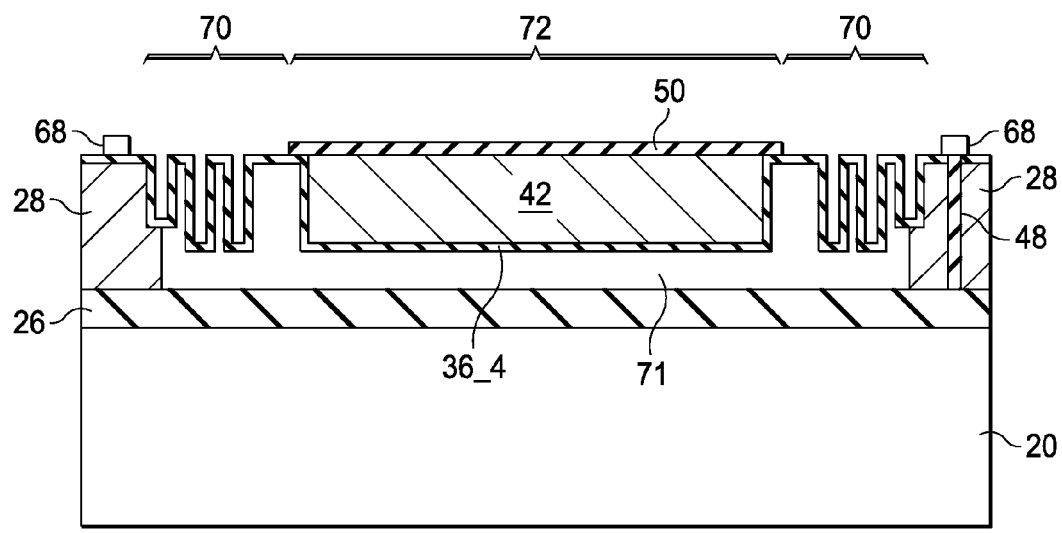
Figure 12B:
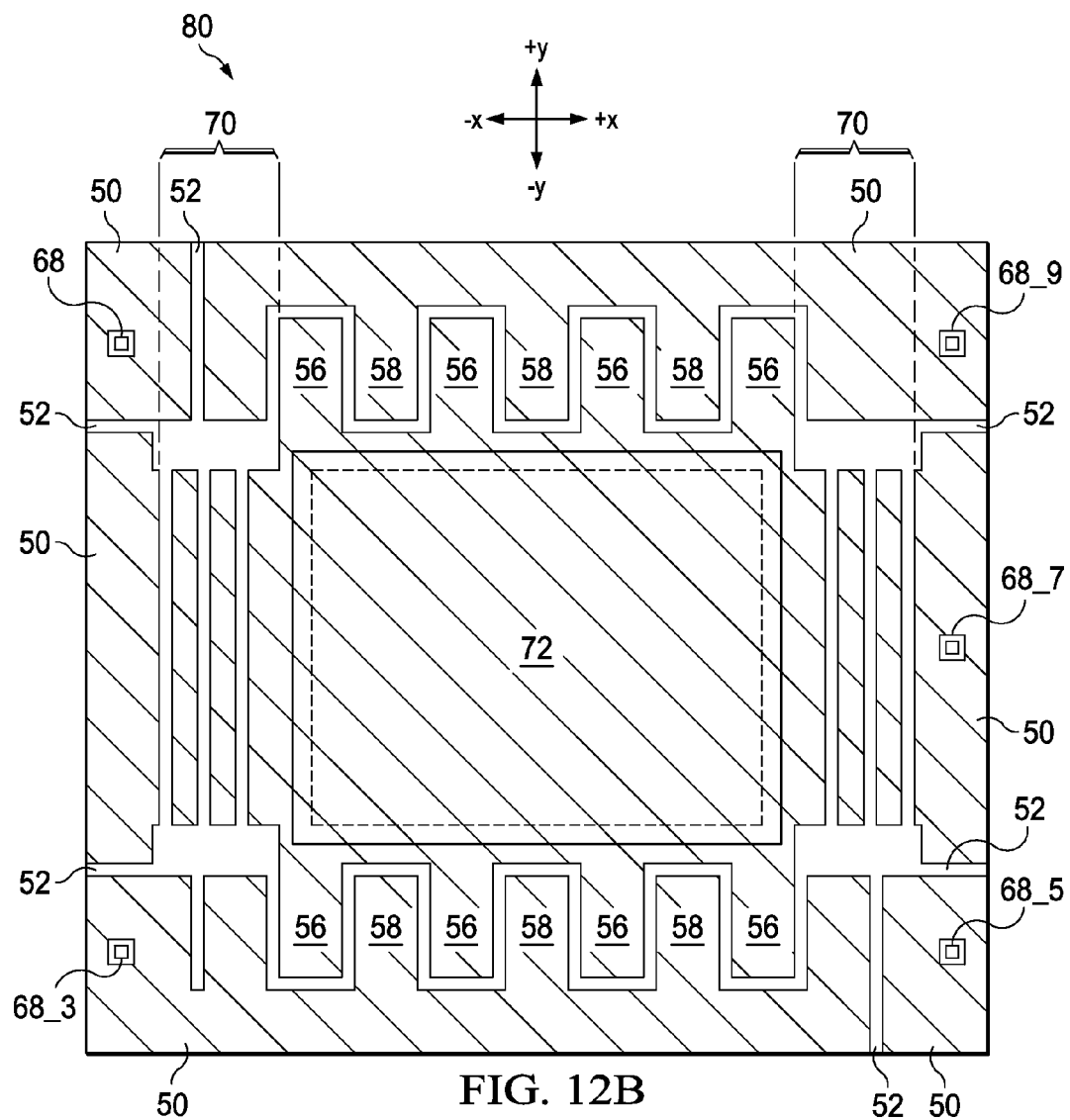

FIGS. 12A and 12B illustrate the release of second conductive layer 36 from underlying dielectric layer 28. In an exemplary embodiment in which dielectric layer 28 is formed of silicon oxide, the release is performed using HF solution. The remaining portion of second conductive layer 36 hence forms springs 70. Central block 42 is fully protected by conductive layers 36 (denoted as 36_4) and 50, and hence is not etched during the release step. The portions of conductive layers 36 and 50 that enclose dielectric central block 42 form proof-mass 72 with central block 42. Proof-mass 72 is spaced apart from polysilicon layer 26 by air space 71, which resulted from removing the portion of dielectric layer 28 directly underlying proof-mass 72.

Figure 13:
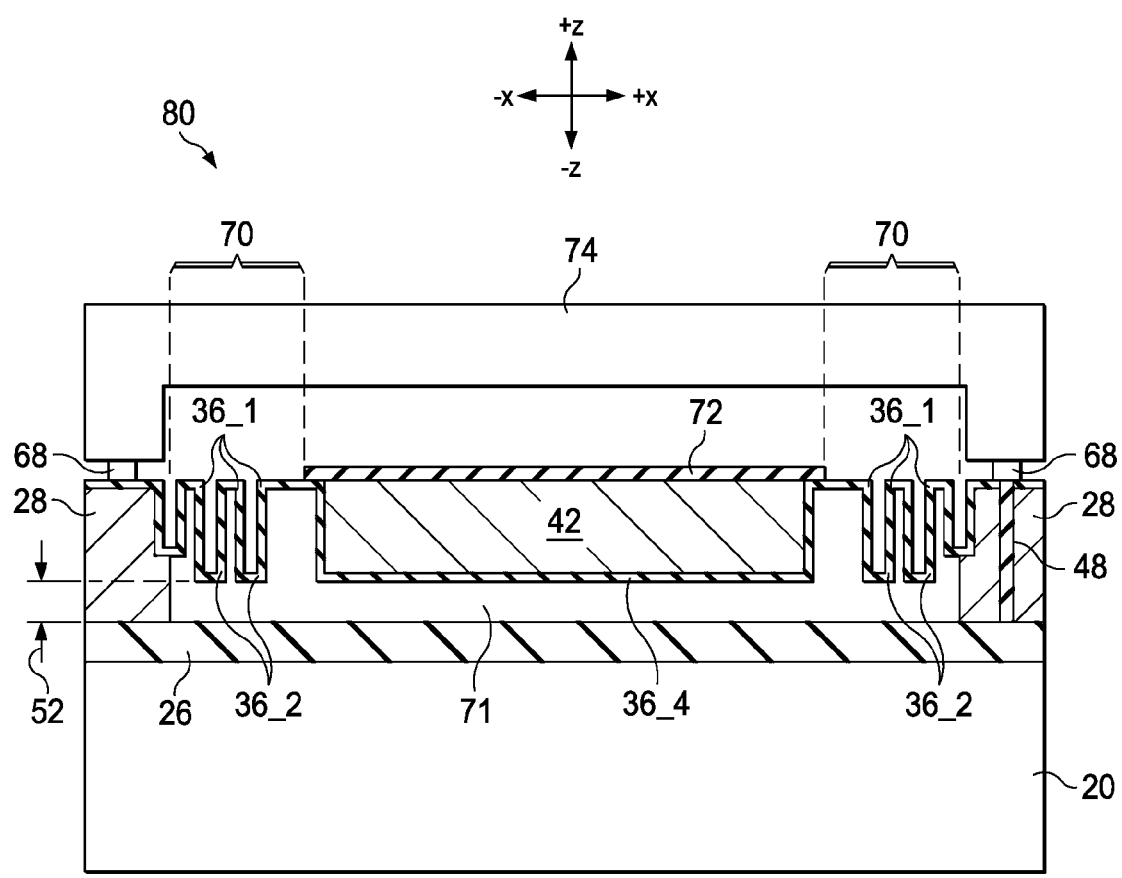

FIG. 13 illustrates the formation of cap 74, which protects the accelerometer from damage and contamination from the external environment. The electrical connection to contact pads 68 (denoted as 68_3, 68_5, 68_7, 68_9, and the like, in FIG. 12B) is also made to finish the manufacturing of accelerometer 80. In the resulting accelerometer 80, portion 36_4, which is underlying dielectric central block 42, forms one capacitor electrode of a z-axis capacitor, while polysilicon layer 26 acts as the other axis of the z-axis capacitor. Springs 70 are anchored onto dielectric layer 28 and allow and support proof-mass 72 to move in the z directions (+z or −z directions). When no acceleration occurs, the distance S2 has a first value. When the structure as shown in FIG. 13 experiences acceleration in the z-axis, distance S2 changes. The capacitance of the z-axis capacitor thus changes to reflect the z-axis acceleration rate.

Referring back to FIG. 12B, contact pad 68_7 is electrically coupled to proof-mass 72 through springs 70. Contact pads 68_9 and 68_3 are connected to the connecting patterned polysilicon layer 50, which form capacitors with proof-mass 72 through fingers 56 and 58. When proof-mass 72 moves in the x directions (+x or −x direction) due to the acceleration in the x directions, the capacitance of the capacitor between fingers 56 and 58 changes, and the capacitance of the capacitor between contact pads 68_7 and 68_9/68_3 changes. The change in the capacitance thus reflects the acceleration in the x directions. Accordingly, the structure as shown in FIGS. 12A, 12B and 13 is a double-axis accelerometer.

Figure 14:
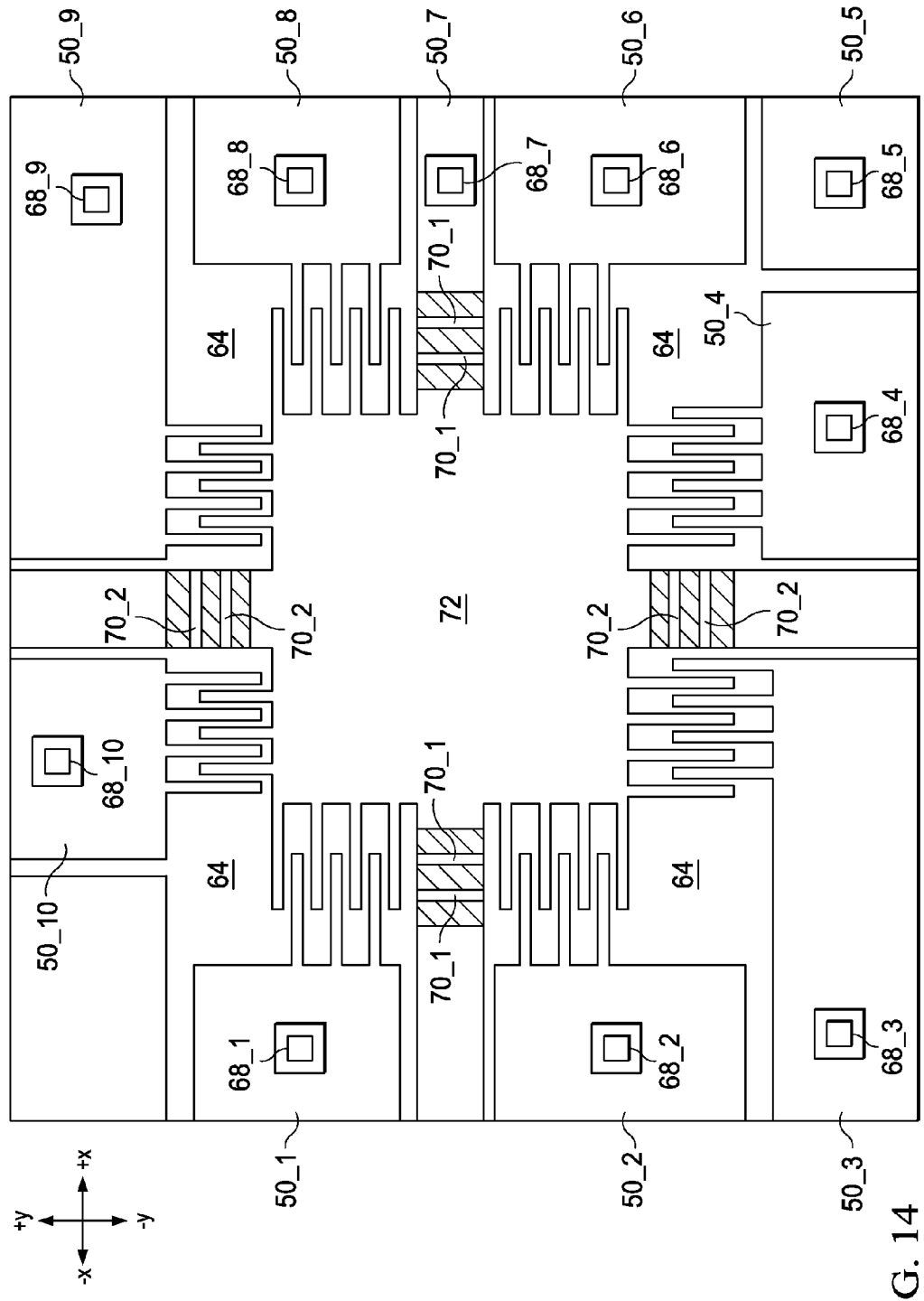
FIG. 14 illustrates a top view of a triple-axis accelerometer.

The processes shown in FIGS. 3 through 13 may be modified to form a triple-axis accelerometer. The required process steps and masks are essentially the same as shown in FIGS. 3 through 13, except the patterns of the masks may be modified. One skilled in the art will be able to find the appropriate mask patterns by combining the teaching related to FIGS. 3 through 13 with the teaching related to FIG. 14. FIG. 14 illustrates a top view of the triple-axis accelerometer. Springs 70 include springs 70_1, which allow the x-direction movement of proof-mass 72. Proof-mass 72 forms x-direction capacitors with polysilicon portions 50_3, 50_4, 50_9, and 50_10 (through the respective alternating fingers), which are used to measure the x-direction acceleration rate. The connections to polysilicon portions 50_3, 50_4, 50_9, and 50_10 are made through contact pads 68_3, 68_4, 68_9, and 68_10, respectively. Springs 70 also include springs 70_2, which allow the y-direction movement of proof-mass 72. Proof-mass 72 forms y-direction capacitors with polysilicon portions 50_1, 50_2, 50_6, and 50_8 (through the respective alternating fingers), which are used to measure the y-direction acceleration rate. The connections to polysilicon portions 50_1, 50_2, 50_6, and 50_8 are made through contact pads 68_1, 68_2, 68_6, and 68_8, respectively.

In addition, springs 70_1 and 70_2 both support (suspend) proof-mass 72. Springs 70_1 and 70_2 make the z-direction movement of proof-mass 72 possible. The z-direction acceleration rate may be measured through contact pads 68_7 and 68_5, which are connected to conductive layer portion 36_4 and first conductive layer 26 (not shown in FIG. 14, please refer to FIG. 13), respectively. Accordingly, the accelerometer as shown in FIG. 14 is a triple-axis accelerometer. It is noted that springs 70 have an up-and-down pattern including upper portions 36_1, lower portions 36_2, and vertical portions connecting upper portions 36_1 to lower portions 36_2 (FIG. 13). In other words, springs 70 are zigzagged in z directions. This is different from conventional springs used in accelerometers, in which the springs are zigzagged in x directions and y directions. With springs 70 zigzagged in z directions, proof-mass 72 can move in z-directions more freely, and hence the resulting accelerometer is more sensitive to the acceleration in the z directions.

Although the present invention and its advantages have been described in detail, it should be understood that various changes, substitutions, and alterations can be made herein without departing from the spirit and scope of the invention as defined by the appended claims. Moreover, the scope of the present application is not intended to be limited to the particular embodiments of the process, machine, manufacture, and composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps. In addition, each claim constitutes a separate embodiment, and the combination of various claims and embodiments are within the scope of the invention.

What is claimed is:

1. An integrated circuit structure comprising:
   a substrate having a top surface;
   a proof-mass over the substrate and comprising a first conductive layer at a bottom of the proof-mass;
   springs connected to the proof-mass, wherein the springs comprise:
      horizontal upper portions substantially parallel to the top surface;
      horizontal lower portions substantially parallel to the top surface, wherein the horizontal upper portions and the horizontal lower portions are vertically mis-aligned; and
      connecting portions connected between the horizontal upper portions and the horizontal lower portions;
   a second conductive layer spaced apart from the first conductive layer by an air space, wherein the first conductive layer and the second conductive layer are parallel to each other to form a capacitor;
   a first contact pad and a second contact pad coupled to the first conductive layer and the second conductive layer, respectively.

2. The integrated circuit structure of claim 1, wherein the springs and the proof-mass are configured to allow the proof-mass to make three-directional movements.

3. The integrated circuit structure of claim 1, wherein the proof-mass comprises a dielectric material, and a conductive material enclosing the dielectric material.

4. The integrated circuit structure of claim 3, wherein the conductive material comprises polysilicon.

5. The integrated circuit structure of claim 1, wherein the springs comprise:
   first springs on opposite sides of the proof-mass, wherein the first springs and the proof-mass are aligned in a first direction in a plane parallel to the top surface of the substrate; and
   second springs on opposite sides of the proof-mass, wherein the second springs and the proof-mass are aligned in a second direction in the plane, and wherein the second direction is perpendicular to the first direction.

6. The integrated circuit structure of claim 1, wherein the proof-mass is connected to first conductive fingers, and wherein the integrated circuit structure further comprises:
- second conductive fingers disconnected from the first conductive fingers, wherein the first conductive fingers and the second conductive fingers are allocated in an alternating pattern; and
- a third contact pad electrically coupled to the second conductive fingers.

7. An integrated circuit structure comprising:
- a substrate having a top surface; and
- a triple-axis accelerometer comprising:
  - a first conductive layer over and contacting the top surface of the substrate, wherein the first conductive layer forms a first capacitor plate of a first capacitor;
  - a proof-mass comprising:
    - a central block formed of a first material; and
    - a second conductive layer formed of a second material different from the first material, wherein the second conductive layer encloses the central block, and wherein a bottom portion of the second conductive layer forms a second capacitor plate of the first capacitor; and
  - an air space over the first capacitor plate and between the first capacitor plate and the second capacitor plate.

8. The integrated circuit structure of claim 7 further comprising springs connected to the proof-mass, wherein the springs are configured to allow the proof-mass to move in a direction perpendicular to the top surface of the substrate.

9. The integrated circuit structure of claim 8, wherein each of the springs comprises:
- horizontal upper portions substantially parallel to the top surface;
- horizontal lower portions substantially parallel to the top surface and vertically not overlapping the horizontal upper portions; and
- connecting portions connecting the horizontal upper portions to the horizontal lower portions.

10. The integrated circuit structure of claim 8 further comprising:
- a first contact pad contacting the second conductive layer;
- a contact plug extending down from a first level substantially level with a top surface of the central block to the first conductive layer; and
- a second contact pad electrically coupled to the first conductive layer through the contact plug.

11. The integrated circuit structure of claim 8, wherein the springs are further configured to allow the proof-mass to move in a first direction and a second direction, and wherein the first direction and the second direction are parallel to the top surface of the substrate and perpendicular to each other.

12. The integrated circuit structure of claim 11 further comprising conductive regions in a same level as a top portion of the second conductive layer, wherein the conductive regions and the top portion of the second conductive layer form a second capacitor and a third capacitor, and wherein a capacitance of the second capacitor is configured to change in response to a movement of the proof-mass in the first direction, and a capacitance of the third capacitor is configured to change in response to a movement of the proof-mass in the second direction.

13. The integrated circuit structure of claim 7, wherein the second conductive layer comprises polysilicon, and wherein the central block is formed of a dielectric material.

14. An integrated circuit structure comprising:
- a substrate having a top surface;
- a first conductive layer over and contacting the top surface of the substrate;
- a dielectric layer over and contacting the first conductive layer, wherein the dielectric layer comprises an opening exposing a portion of the first conductive layer;
- a proof-mass in the opening and comprising a second conductive layer at a bottom of the proof-mass, wherein the second conductive layer is spaced apart from the portion of the first conductive layer by an air space; and
- springs anchoring the proof-mass to portions of the dielectric layer encircling the opening, wherein the springs are configured to allow the proof-mass to make three-dimensional movements.

15. The integrated circuit structure of claim 14, wherein the proof-mass comprises:
- a central block formed of a first material; and
- a third conductive layer on a top surface and sidewalls of the central block, wherein the second conductive layer and the third conductive layer fully enclose the central block.

16. The integrated circuit structure of claim 14, wherein the springs comprise:
- a first spring and a second spring on opposite sides of the proof-mass, wherein the first spring, the second spring, and the proof-mass are aligned in a first direction parallel to the top surface of the substrate; and
- a third spring and a fourth spring on opposite sides of the proof-mass, wherein the third spring, the fourth spring, and the proof-mass are aligned in a second direction parallel to the top surface of the substrate and perpendicular to the first direction, wherein each of the first spring, the second spring, the third spring, and the fourth spring comprises:
  - horizontal upper portions substantially level with a top surface of the proof-mass;
  - horizontal lower portions substantially level with a bottom surface of the proof-mass; and
  - connecting portions connecting the horizontal upper portions and the horizontal lower portions.

17. The integrated circuit structure of claim 14, wherein the first conductive layer and the second conductive layer comprise doped polysilicon, and wherein the central block comprises silicon oxide.

18. The integrated circuit structure of claim 14, wherein the integrated circuit structure is configured to measure a first movement of the proof-mass in a first horizontal direction parallel to the top surface of the substrate, a second movement of the proof-mass in a second horizontal direction parallel to the top surface of the substrate and perpendicular to the first direction, and a third movement of the proof-mass in a direction perpendicular to the first direction and the second direction.

19. The integrated circuit structure of claim 14, wherein the first conductive layer and the second conductive layer have a distance between about 2 μm and about 3 μm.

20. The integrated circuit structure of claim 14, wherein the dielectric layer has a thickness between about 25 μm and about 30 μm.

* * * * *